United States Patent
Lehr et al.

(10) Patent No.: US 8,216,880 B2
(45) Date of Patent: Jul. 10, 2012

(54) WIRE BONDING ON REACTIVE METAL SURFACES OF A METALLIZATION OF A SEMICONDUCTOR DEVICE BY PROVIDING A PROTECTION LAYER

(75) Inventors: Matthias Lehr, Dresden (DE); Frank Kuechenmeister, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/235,653

(22) Filed: Sep. 19, 2011

(65) Prior Publication Data

US 2012/0009780 A1     Jan. 12, 2012

Related U.S. Application Data

(62) Division of application No. 12/365,963, filed on Feb. 5, 2009, now Pat. No. 8,043,956.

(30) Foreign Application Priority Data

Mar. 31, 2008  (DE) .......................... 10 2008 016 427

(51) Int. Cl.
*H01L 21/00* (2006.01)
*H01L 21/44* (2006.01)
*H01L 21/4763* (2006.01)

(52) U.S. Cl. . 438/106; 438/617; 438/637; 257/E21.499; 257/E21.506; 257/E21.509; 257/E21.51

(58) Field of Classification Search .................. 438/106, 438/617, 637; 257/E21.499, E21.506, E21.509, 257/E21.51

See application file for complete search history.

(56) References Cited

U.S. PATENT DOCUMENTS

| | | | | |
|---|---|---|---|---|
| 3,629,669 A | * | 12/1971 | Kauppila | 257/389 |
| 5,810,609 A | * | 9/1998 | Faraci et al. | 439/71 |
| 6,333,207 B1 | * | 12/2001 | Light et al. | 438/106 |
| 6,977,217 B1 | * | 12/2005 | Ben-Tzur et al. | 438/627 |
| 2004/0099961 A1 | | 5/2004 | Chu et al. | 257/781 |
| 2005/0067710 A1 | * | 3/2005 | Lytle et al. | 257/774 |
| 2005/0224987 A1 | | 10/2005 | Hortaleza et al. | 257/765 |
| 2006/0170114 A1 | * | 8/2006 | Su et al. | 257/784 |
| 2008/0213996 A1 | | 9/2008 | Dubin et al. | 438/653 |

FOREIGN PATENT DOCUMENTS

JP  06097292 A  4/1994
WO  WO 03/075340 A2  9/2003

OTHER PUBLICATIONS

Translation of Official Communication from German Patent Office for German Patent Application No. 10 2008 016 427.5 dated Dec. 9, 2008.

* cited by examiner

*Primary Examiner* — Charles Garber
*Assistant Examiner* — Ron Pompey
(74) *Attorney, Agent, or Firm* — Williams, Morgan & Amerson, P.C.

(57) ABSTRACT

In semiconductor devices having a copper-based metallization system, bond pads for wire bonding may be formed directly on copper surfaces, which may be covered by an appropriately designed protection layer to avoid unpredictable copper corrosion during the wire bond process. A thickness of the protection layer may be selected such that bonding through the layer may be accomplished, while also ensuring a desired high degree of integrity of the copper surface.

14 Claims, 7 Drawing Sheets

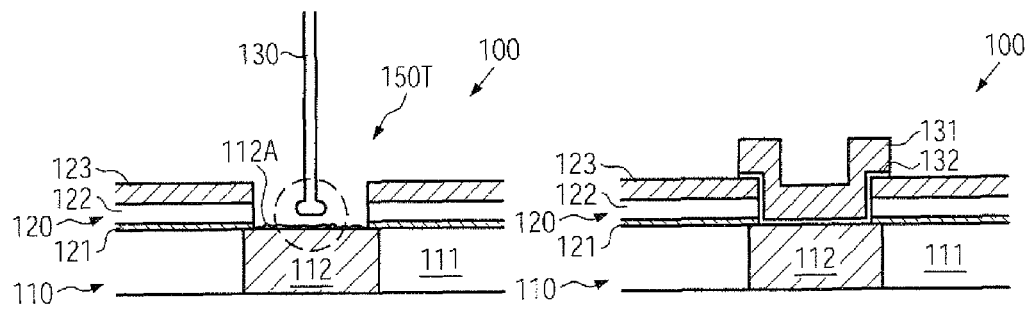
FIG. 1a (prior art)
FIG. 1b (prior art)
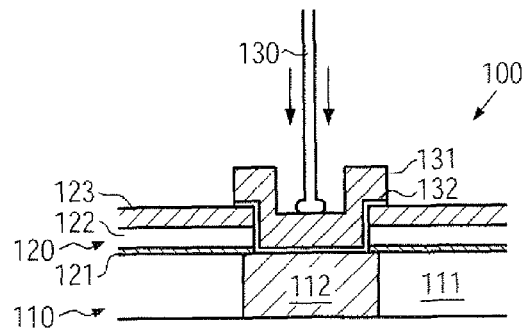
FIG. 1c (prior art)

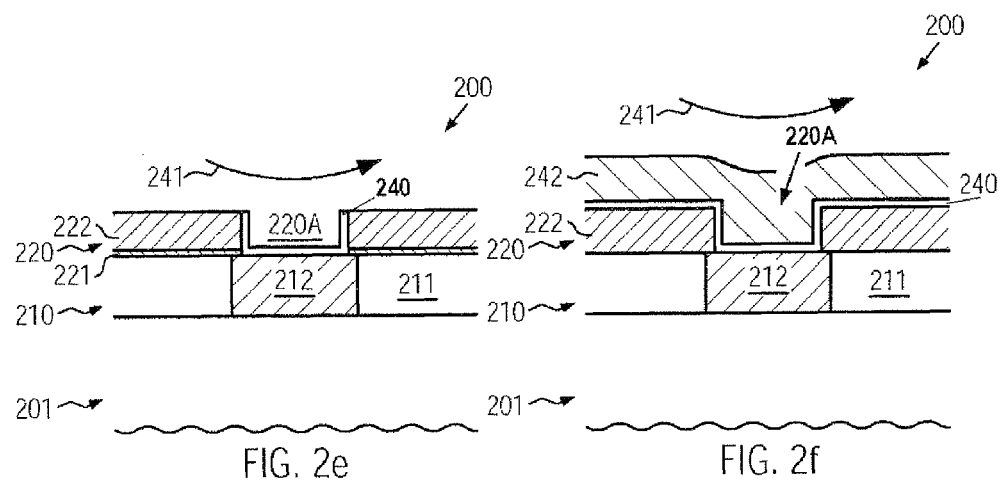
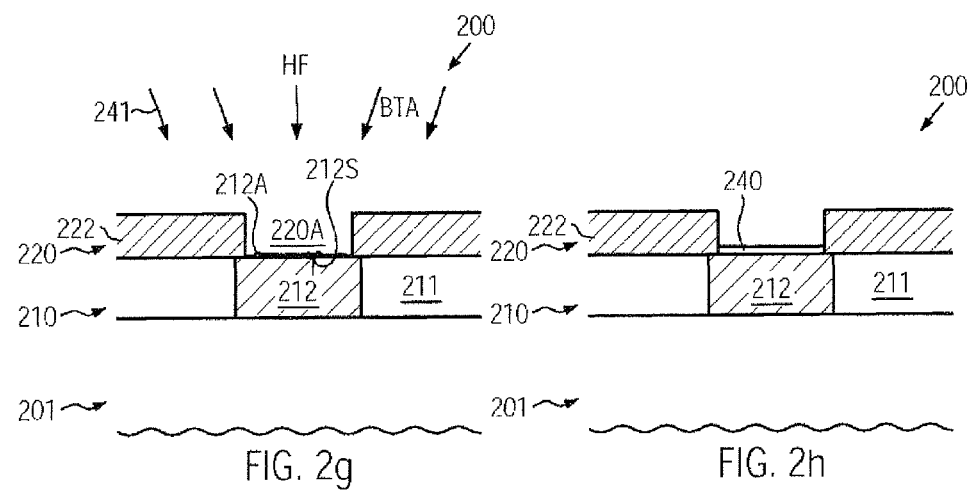

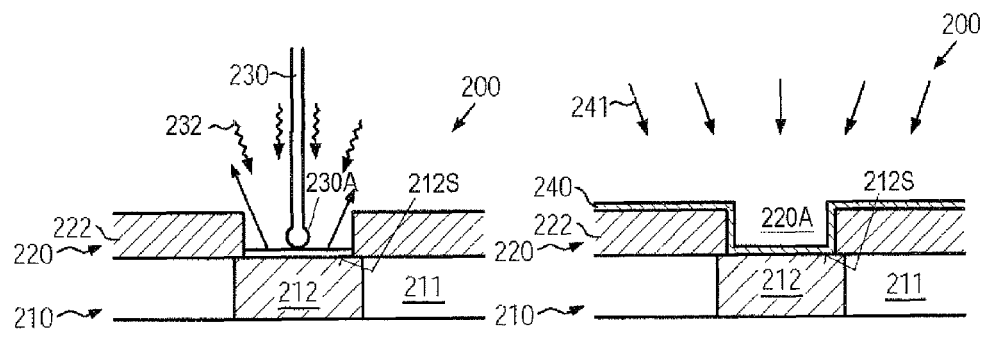
FIG. 2i
FIG. 2j
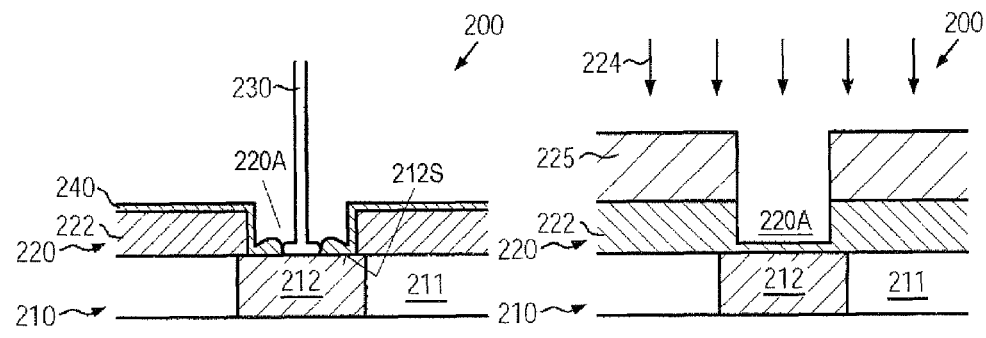
FIG. 2k
FIG. 2l

WIRE BONDING ON REACTIVE METAL SURFACES OF A METALLIZATION OF A SEMICONDUCTOR DEVICE BY PROVIDING A PROTECTION LAYER

CROSS-REFERENCE TO RELATED APPLICATION

This is a divisional of co-pending application Ser. No. 12/365,963, filed Feb. 5, 2009.

BACKGROUND OF THE INVENTION

1. Field of the Invention

The present disclosure generally relates to the field of integrated circuits, and, more particularly, to a back end of line processing for a wire bonding structure in sophisticated metallization structures, including highly reactive metals, such as copper and the like.

2. Description of the Related Art

The manufacturing of integrated circuits involves many complex process steps to form circuit elements, such as transistors, capacitors, resistors and the like, in and above an appropriate semiconductor material. In recent years, enormous advances have been made in increasing integration density and overall functionality of the integrated circuits. These advances have been achieved by scaling the individual circuit elements to dimensions in the deep sub-micrometer range, with currently used critical dimensions, such as the gate length of a field effect transistor, of 30 nm and less. Hence, millions of circuit elements may be provided in a die, wherein a complex interconnect fabric may also have to be designed, in which each circuit element typically may be electrically connected to one or more other circuit elements. These interconnect structures are typically established in a metallization system comprising one or more wiring levels, in which appropriate metal features are formed according to the circuit configuration under consideration, in a similar manner as a multi-level printed circuit board, wherein, however, the dimensions of the metal features have to adapted to the dimensions of the semiconductor circuit elements, such as the transistors and the like. Over many decades, aluminum has been used as the metal of choice for forming the metal features in the metallization layers of the semiconductor devices, due to its moderately high thermal and electrical conductivity, its self-limiting creation of a passivating oxide layer and its compatibility with other materials and process techniques used for fabricating integrated devices. With the continuous reduction of the circuit dimensions, the dimensions of the metal features have resulted in a situation in which the overall signal delay in the devices is no longer restricted by the performance of the individual semiconductor circuit elements, such as the switching speed of the transistors, but is substantially determined by the parasitic time constants in the metallization system caused by the restricted conductivity of aluminum and the parasitic capacitance between neighboring metal regions. Therefore, in modern integrated circuits, highly conductive metals, such as copper and alloys thereof, are used to accommodate the high current densities encountered during the operation of the devices, while the parasitic capacitance may be reduced by using low-k dielectric materials, which are to be understood as dielectrics having a dielectric constant of 3.0 or less.

In an advanced stage of the manufacturing of integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer of at least one of the units, for instance on a dielectric passivation layer of the microelectronic chip. In order to connect the microelectronic chip with the corresponding carrier, the surfaces of two respective units to be connected, i.e., the microelectronic chip comprising, for instance, a plurality of integrated circuits, and a corresponding package have formed thereon adequate pad arrangements to electrically connect the two units after reflowing the solder bumps provided at least on one of the units, for instance on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O (input/output) capability as well as the desired low capacitance arrangement required for high frequency applications of modern microelectronic chips that usually include complex circuitry, such as microprocessors, storage circuits and the like, and/or include a plurality of integrated circuits forming a complete complex circuit system.

Another approach for connecting chips with a package includes wire bonding techniques, which have been successfully developed over the last decades on the basis of aluminum and are still well established and represent the dominant technology for connecting the fast majority of semiconductor chips to a carrier substrate, wherein aluminum-based bond pads are usually provided which are contacted by an appropriate wire made of aluminum, copper, gold and the like. During the wire bonding process, the bond wire is treated to form a small ball at one end that is then brought into contact with the bond pad. Upon applying pressure, elevated temperature and ultrasonic energy, the wire ball is welded to the bond pad to form an intermetallic connection. However, many advanced semiconductor devices may have a copper-based metallization structure in view of device performance, integration density and process compatibility in facilities fabricating a wide variety of different products, wherein the connection to the carrier substrate is established by wire bonding, due to less demanding I/O capabilities as compared to, for instance, CPUs and other highly complex ICs, and the economic advantages of the wire bonding techniques over complex bump-based techniques. In a production environment, however, the wire bonding on copper bond pads is very difficult to achieve due to an inhomogeneous self-oxidization of the copper surface in combination with extensive corrosion, which may result in highly non-reliable bond connections. For this reason, a different terminal metal, such as an aluminum metal layer, may be used in an advanced metallization structure based on copper, possibly in combination with low-k dielectrics, which may result in a more complex manufacturing process, since respective process tools and processes for forming and patterning aluminum layers have to be provided in the production line. For example, for modern CPUs, in which both wire bonding and direct solder contact regimes using bump structures are to be employed, for instance for packaging respective test structures for monitoring the overall complex process flow of CPUs, significant additional efforts may have to be made during the formation of the bump structure for actual die regions including the CPUs and the wire bonding pads for respective test structures, as will be described in more detail with reference to FIGS. 1a-1c.

FIG. 1a schematically illustrates a cross-sectional view of a conventional semiconductor device 100 in an advanced manufacturing stage. The semiconductor device 100 comprises a substrate 101, which may have formed therein circuit elements and other microstructural elements that, for convenience, are not shown in FIG. 1 a. The device 100 comprises one or more metallization layers including copper-based metal lines and vias, wherein, for convenience, the very last metallization layer 110 is shown, which may comprise a dielectric material 111 having formed therein a copper-containing metal region 112. That is, the metal region 112 may be formed of copper or a copper alloy, possibly in combination with respective barrier materials (not shown), so as to suppress any interaction between the dielectric material 111 and the copper material in the region 112. The metal region 112 may be electrically connected to any circuit elements representing an integrated circuit in accordance with a specific circuit arrangement, or the metal region 112 may represent a contact area connecting to device features representing a test structure so as to characterize specific device characteristics, such as electromigration performance, reliability of gate dielectrics and the like. The semiconductor device 100 further comprises a passivation layer stack 120, which may comprise a plurality of individual layers, indicated as dielectric layers 121, 122 and 123. For example, the dielectric layer 121 may be in direct contact with the metal region 112 and may be comprised of any appropriate material so as to act a as a cap layer for confining the copper material in the region 112. For example, the dielectric layer 121 may be comprised of silicon nitride, silicon carbide, nitrogen-containing silicon carbide and the like. Moreover, the layers 122 and 123 may be provided in any appropriate material composition so as to comply with the further processing of the device 100 and act as an appropriate passivation layer to insure integrity of any underlying components. For example, silicon dioxide, silicon oxynitride, silicon nitride and the like may be used for the dielectric layer 122, and also for the layer 123, depending on the overall process and device requirements. As shown, the passivation layer 120 may expose an appropriate portion of the metal region 112 as may be required for providing an appropriate bond area for receiving a bond wire 130. However, due to the highly reactive nature of the exposed surface portion of the metal region 112, corresponding surface contaminants, such as corrosive areas and the like 112A, may have been created in a more or less pronounced manner, depending on the process history of the device 100.

The semiconductor device 100 as shown in FIG. 1a may be formed on the basis of the following processes. Initially, the substrate 101 and any circuit elements contained therein may be manufactured on the basis of well-established process techniques, wherein, in sophisticated applications, circuit elements having critical dimensions on the order of magnitude of approximately 50 nm and less may be formed, followed by application of the one or more metallization layers 110 including copper-based metal lines and vias, wherein typically low-k dielectric materials are used for at least some of the dielectric materials in the metallization system of the device 100. The process sequence for forming the metallization layer 110 representing the very last metallization level of the device 100 typically includes the deposition of the dielectric material 111 and the patterning thereof, followed by filling in the copper-containing material, for instance on the basis of electrochemical deposition techniques, wherein the deposition of appropriate barrier materials, such as tantalum, tantalum nitride and the like, may precede the deposition of the copper material. After removal of any excess material, the dielectric layer 121 may be formed, for instance, by appropriate deposition techniques, thereby confining the copper-based materials, such as the metal region 112. Next, the further dielectric layers 122 and 123 of the passivation layer stack 120 may be formed on the layer 121 on the basis of any appropriate deposition technique, such as plasma enhanced chemical vapor deposition (PECVD) and the like. Thereafter, a photolithography process is performed to provide a resist mask (not shown) having a shape and dimension that substantially determines the actual bond area for connecting the bond wire 130 with the exposed portion of the metal region 112. Subsequently, the dielectric layer stack 120 may be patterned on the basis of the previously defined resist mask, which may finally be removed by well-established process techniques. As previously explained, a copper-containing surface that may be exposed during various manufacturing stages may readily react with aggressive components, such as oxygen, fluorine and the like, thereby creating the contaminants 112A in a highly non-homogeneous manner and providing very non-uniform process conditions during a bond process for connecting the bond wire 130 with the metal region 112. Consequently, the reliable intermetallic connection between the bond wire 130 and the surface of the metal region 112 may be difficult to be achieved and, therefore, in conventional approaches, the device 100 may receive an aluminum-based terminal metal layer so as to allow the application of well-approved wire bonding techniques on the basis of aluminum.

FIG. 1b schematically illustrates the conventional semiconductor device 100 in a further advanced manufacturing stage, in which an aluminum layer 131 may be formed above the exposed portion of the metal region 112. Furthermore, as shown, a barrier/adhesion layer 132 may be positioned between the aluminum layer 131 and the metal region 112 and the respective part of the dielectric layer stack 120. The barrier/adhesion layer 132 may, for instance, be comprised of tantalum, tantalum nitride, titanium, titanium nitride or other similar metals and compounds thereof as are typically used in combination with copper metallization systems in order to effectively reduce copper diffusion and enhance adhesion of the aluminum layer 131. Typically, the device 100 as shown in FIG. 1b may be formed by first depositing the barrier/adhesion layer 132, for instance on the basis of sputter deposition techniques, followed by the deposition of the aluminum layer 131, for instance by sputter deposition, chemical vapor deposition and the like. Next, a lithography process is performed to create a resist mask (not shown), which may be used as an etch mask during a reactive etch process, which may be performed, for instance, on the basis of a complex chlorine-based etch chemistry in order to obtain the patterned aluminum layer 131, as shown in FIG. 1b. Furthermore, the respective etch process may also include a separate etch step for etching through the barrier/adhesion layer 132, followed by a wet chemical process for removing any corrosive etch residues generated during the complex aluminum etch step.

FIG. 1c schematically illustrates the semiconductor device 100 in a further advanced manufacturing stage, in which the bond wire 130 may be bonded to the aluminum layer 131 by well-established process techniques, in which an end of the bond wire 130 may be attached to the exposed surface of the aluminum layer 131 while also applying heat and/or ultrasonic energy and pressure, thereby obtaining an intermetallic connection between a portion of the aluminum layer 131 and the bond wire 130.

Consequently, in the conventional approach described above, efficient wire bond techniques may be used on the basis of the aluminum layer 131, thereby, however, requiring a complex process sequence for depositing and patterning the barrier/adhesion layer 132 and the aluminum layer 131. Consequently, in a complex manufacturing environment, respective resources for depositing and patterning the aluminum layer 131 in combination with the barrier/adhesion layer 132 may have to be provided in addition to equipment and materials required for the formation of a complex copper-based metallization system, thereby contributing to increased cycle times and thus production costs.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which wire bonding in copper-based metallization structures may be accomplished without using aluminum-based techniques by passivating an exposed copper-containing surface prior to and during the wire bonding process. For this purpose, an appropriate protective layer with a suitably adapted thickness may be formed after patterning the passivation layer stack, wherein the protective layer may be maintained during the wire bonding process, thereby providing uniform process conditions while not negatively affecting the bond process. That is, the protective layer may sufficiently passivate the reactive copper surface while also allowing the attaching of a bond wire "through" the protective layer, thereby obtaining a reliable intermetallic connection between the copper material and the bond wire, wherein, in some illustrative aspects disclosed herein, material of the protective layer may be provided as a type of material that may have to be used in previous manufacturing sequences, thereby substantially not contributing to increased requirements in terms of additional process tools. In some illustrative aspects, the processing of aluminum may be avoided during the formation of a copper-based metallization system and a corresponding wire bonding process, thereby significantly reducing overall process complexity and production costs compared to conventional approaches, as previously described.

One illustrative method disclosed herein comprises forming a dielectric layer stack above a metallization layer that is formed above a substrate of a semiconductor device, wherein the metallization layer comprises a contact region having a copper-containing surface for receiving a bond wire. The method further comprises forming an opening in the dielectric layer stack to expose a portion of the surface and forming a protection layer at least on the portion of the surface. Finally, the method comprises attaching a lead wire to the portion in the presence of the protection layer.

A further illustrative method disclosed herein comprises forming a dielectric layer stack above a metallization layer that is formed above a substrate of a semiconductor device, wherein the metallization layer comprises a metal region for connecting to a bond wire. Moreover, a recess is formed in the dielectric layer stack to define a bond area of the metal region, wherein a bottom layer of the recess covers the metal region. Additionally, the method comprises bonding a lead wire to the metal region in the presence of the bottom layer.

One illustrative semiconductor product disclosed herein comprises a substrate and a metallization system comprising a last metallization layer, which is formed above the substrate. Furthermore, the semiconductor product comprises a dielectric layer stack formed above the last metallization layer and a bond pad is provided, which is formed in an opening of the dielectric layer stack, wherein the bond pad comprises a copper-containing surface, a portion of which is covered by a first material. Moreover, a bond wire is bonded to a portion of the surface, and a second material is provided that encloses the bond pad and the bond wire, wherein the second material differs from the first material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c schematically illustrate cross-sectional views of a conventional semiconductor device during various manufacturing stages in forming a wire bond connection on the basis of a copper-containing metallization system and a terminal aluminum layer, according to conventional strategies;

FIGS. 2a-2c schematically illustrate cross-sectional views of a semiconductor device during various manufacturing stages in forming a wire bond connection on a copper-based metal region using a selectively formed protective layer, according to illustrative embodiments;

FIGS. 2d-2f schematically illustrate cross-sectional views of the semiconductor device, according to further illustrative embodiments, in which a protective layer may be formed by global deposition and selective removal from horizontal portions of a dielectric layer stack;

FIGS. 2g-2i schematically illustrate cross-sectional views of the semiconductor device during various manufacturing stages in selectively forming a protective layer by a wet chemical treatment, which may be combined with the removal of corrosive contaminants;

FIGS. 2j-2k schematically illustrate the semiconductor device during the global deposition of a dielectric protective layer and a subsequent wire bonding process through the protective layer, according to still other illustrative embodiments;

FIGS. 2l-2m schematically illustrate cross-sectional views of the semiconductor device during various phases of an etch process for forming an opening in the dielectric layer stack with a final polymerization process so as to obtain a protective polymer layer, according to still further illustrative embodiments;

Figures 2A, 2B:
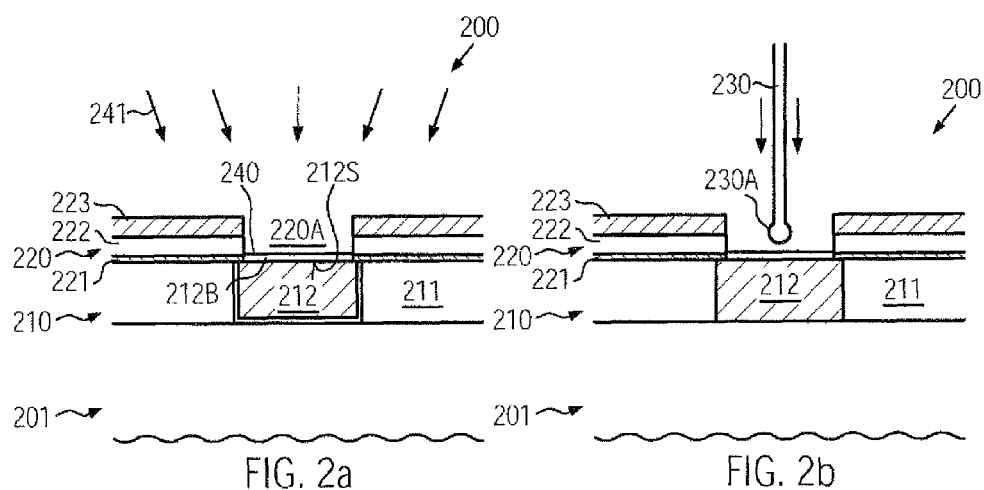

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein relates to techniques and semiconductor devices in which wire bonding structures may be formed on the basis of a substantially aluminum-free metallization system, wherein a reliable intermetallic connection between the bond wire and a copper-containing surface may be accomplished by performing the wire bond process in the presence of an appropriately designed protective layer. For this purpose, a process technique may be used in which well-established materials, as may typically be used during the formation of advanced semiconductor devices, may also be employed during the fabrication of the wire bond structure and the protective layer so as to reduce efforts in terms of equipment and process time compared to conventional techniques using an aluminum terminal metal layer. Due to the provision of the protective layer, the sensitive copper-containing surface may be passivated prior to and during the wire bonding process, thereby significantly reducing any non-predictable chemical interaction with reactive components, such as oxygen, fluorine and the like, thereby providing reliable intermetallic connections between the bond wire and the copper-containing surface. The protective layer may be formed on the basis of well-established process techniques, such as the electrochemical deposition of appropriate compounds, which may be selectively deposited on the exposed portion of the copper-containing surface, wherein the patterned dielectric layer stack may act as an efficient deposition mask. In other cases, an appropriate material, such as a conductive barrier material, as may also be used in the metallization levels, may be deposited and may be subsequently patterned, for instance, by planarization techniques, so as to be removed at least outside of the opening in the dielectric layer stack. In still other illustrative embodiments, after the patterning of the passivation layer stack, any appropriate dielectric material may be deposited with an appropriate thickness and may be maintained during the wire bonding process and the further processing for enclosing the semiconductor device in a package material, thereby providing a highly efficient overall process flow. In still other illustrative embodiments disclosed herein, the protective layer may be provided as a part of the dielectric layer stack, wherein a layer thickness may be defined by deposition and/or parameters during the formation and patterning of the final dielectric layer stack. Consequently, by providing the protective layer and performing the wire bonding process in the presence of the protective layer, the implementation of the processing of cost-intensive materials, such as gold, aluminum and the like, may be avoided, while, nevertheless, providing reliable intermetallic connections for highly advanced metallization systems formed on the basis of copper and low-k dielectric materials.

FIG. 2a schematically illustrates a cross-sectional view of a semiconductor device 200 in an advanced manufacturing stage for forming a wire bond structure on the basis of a complex metallization system comprising copper or any other highly conductive and reactive materials. The semiconductor device 200 may comprise a substrate 201 in and above which microstructure features, such as circuit elements of sophisticated integrated circuits and the like, may be formed in accordance with device requirements. It should be appreciated that the substrate 201 may comprise any appropriate material composition for forming therein and thereon the required microstructure features, at least a portion of which may require a metallization system, that is, one or more metallization layers including copper-containing metal regions. For example, the substrate 201 may comprise any appropriate carrier material, for instance in the form of an insulating material, semiconductor material, possibly in combination with a buried insulating layer, on which a further semiconductor material may be formed, thereby establishing a semiconductor-on-insulator (SOI) configuration, and the like. Hence, above one or more levels, which may comprise semiconductor elements, such as transistors, capacitors and the like, at least one metallization level may be provided, while, typically, for microstructure devices including complex circuitry, a plurality of metallization levels may be used, which may include highly conductive metals, such as copper, copper alloys, silver and the like, possibly in combination with conventional dielectrics and low-k dielectrics, as previously explained. For convenience, the very last metallization level 210 is illustrated, which may comprise an appropriate dielectric material 211, for instance in the form of a low-k dielectric material, possibly in combination with conventional dielectrics, depending on the overall device characteristics. Furthermore, the last metallization layer 210 may comprise a metal region 212 having a top surface 212S, at least a portion of which may act as a contact area for receiving a bond wire in a later manufacturing stage. The metal region 212 may represent a highly conductive metal, which may comprise copper so as to comply with the materials and manufacturing techniques of lower-lying metallization levels without requiring complex aluminum-based process strategies, as previously explained with reference to the semiconductor device 100. Thus, in some illustrative embodiments, the surface 212S represents a copper-containing surface, which may suffer from increased creation of contaminants upon exposure to a reactive ambient, such as ambient air, a plasma ambient containing reactive components, such as fluorine, oxygen and the like. Typically, the metal region 212 may comprise a barrier material 212B, for instance in the form of tantalum, tantalum nitride, titanium, titanium nitride or any other appropriate materials. Furthermore, in the manufacturing stage shown, a passivation layer stack 220 may be positioned above the metallization layer 210 and may comprise one or more dielectric layers of any appropriate composition. For example, in the embodiment shown, the dielectric layer stack 220 may comprise two or more individual material layers, for instance indicated as 221, 222 and 223, wherein it should be appreciated that any number of material layers, for instance one material layer, two material layers, four or more material layers, may be provided in the stack 220, depending on the desired characteristics in view of passivating the underlying components and compatibility with the further processing, as will be described later on in more detail.

For example, at least a portion of the dielectric layer stack 220, such as the first layer 221, may act as a cap layer for confining the metal in the region 212, if any other cap layers, for instance in the form of conductive cap layers and the like, may not be provided on the surface 212S. For instance, silicon nitride, nitrogen-containing silicon carbide and the like may be used for this purpose. Additionally, the layer 221 may be efficiently used during the patterning of the dielectric layer stack 220 so as to act as an etch stop material for enhancing overall process uniformity. Similarly, the one or more additional layers 222, 223 may have any appropriate material composition, for instance in the form of silicon dioxide, silicon nitride, silicon oxynitride and the like. An opening 220A may be formed in the dielectric layer stack 220, thereby defining the lateral size of a portion of the surface 212S acting as the contact area for receiving the bond wire in a later stage. Furthermore, the device 200 may comprise a protective layer 240, which at least covers a portion of the surface 212S defined by the opening 220A so as to substantially suppress any interaction of the sensitive surface 212S with reactive components such as fluorine, oxygen and the like. That is, the material composition and the thickness of the protective layer 240 may be selected such that interaction of the exposed portion of the surface 212S with the ambient may be significantly suppressed, while a bond process to be performed in a later stage may not be substantially negatively affected by the presence of the protective layer 240. For instance, the protective layer 240 may be provided as an insulating material of any composition, wherein a thickness of approximately one to ten nanometers may provide the desired degree of inertness of the exposed portion of the surface 212S. In other cases, a conductive material may be provided for the layer 240, wherein a thickness thereof may be selected in view of maintaining integrity of the surface 212S and with respect to the characteristics of the conductive material during a wire bonding process. That is, for materials having a moderately low conductivity, a reduced thickness in the above-specified range may be selected to ensure reliable cracking of the metal layer 240 during a subsequent wire bonding process in order to obtain an intermetallic connection between the bond wire and the highly conductive surface 212S. In other cases, if the conductive material of the layer 240 may have a positive effect, for instance with respect to adhesion and overall robustness of the wire bond connection, an increased thickness of approximately 10-100 nm may be selected, depending on the overall characteristics of the material of the layer 240 under consideration. For instance, the protective layer 240 may be provided in the form of nickel, palladium and the like, which may be provided with an increased thickness, as specified above, since the overall characteristics during the wire bonding process of these materials, in combination with an acceptable conductivity, may result in an overall enhancement of the finally obtained wire bond structure. That is, these materials may form, in combination with the material of the bond wire and the surface 212S, a robust and highly conductive connection to the metal region 212, even if a direct contact of the bond wire with the surface 212S may be less during the wire bond process compared to a reduced thickness.

In one illustrative embodiment, as illustrated in FIG. 2a, the protective layer 240 may be selectively formed in the opening 220A, on the exposed portion of the surface 212S. For example, compounds of cobalt, tungsten, phosphorous, or compounds of cobalt, tungsten, boron, or compounds of nickel, molybdenum, boron, or compounds of nickel, molybdenum, phosphorous, and the like may be used for forming the protective layer 240. Any such material composition may also be used in lower-lying metallization levels, for instance for forming a conductive cap layer of copper lines to enhance the electromigration behavior, while not unduly reducing the overall conductivity of the copper lines. Thus, respective material resources and deposition tools may be available in the semiconductor facility, thereby avoiding additional efforts in terms of investment costs for respective deposition regimes. In still other illustrative embodiments, metals, such as palladium or nickel, as previously explained, may be employed, individually or in combination, to obtain the protective layer 240. Again, appropriate material sources and deposition tools may be used during the processing of the device 200, so that these resources may be advantageously used for forming the protective layer 240.

In other cases, the protective layer 240 may also be provided on sidewalls of the opening 220A, as will be described later on in more detail. Furthermore, in some cases, the protective layer 240 may be provided as a substantially insulating material, which may be accomplished on the basis of a wet chemical treatment of the exposed portion of the surface 212S, as will be described later on.

The semiconductor device 200 as shown in FIG. 2a may be formed on the basis of the following processes. After forming respective structural features, such as circuit elements and the like, one or more metallization layers may be formed in accordance with well-established techniques, wherein, as a final step, the very last metallization layer 210 may be formed by depositing the dielectric material 211 and patterning the same so as to receive the metal region 212, where similar process techniques may be used, as previously explained with reference to the device 100. Next, the dielectric layer stack 220 may be formed in accordance with any appropriate deposition techniques, for instance using PECVD for forming one or more different material layers, such as the layers 221, 222 and 223. Thereafter, the stack 220 may be patterned by using lithography techniques in accordance with well-established approaches. During the patterning of the layer stack 220, a portion of the surface 212S may be exposed and, if required, an appropriate cleaning process, for instance on the basis of diluted hydrofluoric acid (HF) and the like, may be performed to remove contaminants and the like. Thereafter, the exposed portion of the surface 212S having a reduced degree of contamination may be exposed to a deposition ambient 241, which, in one illustrative embodiment, may be established in the form of a selective electrochemical deposition ambient. For example, plating reactors may be available in the manufacturing environment, which may be used for electrochemically applying conductive cap layers for copper metallizations and the like, which may be efficiently used for the electrochemical deposition 241. In this case, the exposed portion of the surface 212S may act as a catalyst material, thereby initiating the deposition of an appropriate metal or compound, as previously specified, thereby also providing the high selectivity of the deposition process. Consequently, the process 241 may be performed as a non-masked deposition process, thereby providing reduced process complexity.

In some illustrative embodiments, the protective layer 240 may be formed on the basis of selective electrochemical deposition, by using, for instance, one of the above-specified compounds or metals, prior to the deposition of the dielectric layer stack 220. That is, upon forming the metallization layer 210, i.e., patterning the dielectric material 211 and filling respective openings with a copper-containing material in combination with the deposition of the barrier material 212B, if required, the protective layer 240 may be deposited in the form of a cap layer, thereby confining the copper material in the region 212 across the entire surface 212S, which may provide increased flexibility in selecting an appropriate material for the dielectric layer stack 220, since the copper-confining characteristics of a material portion that is in immediate contact with the metal region 212 may be less critical, since confinement may be accomplished by the protective layer 240. For example, in this case, the layer 221 may be provided with respect to its etch stop characteristics during the patterning of the stack 220 so as to maintain a desired high degree of integrity of the protective layer 240, the thickness of which may have been selected in view of maintaining integrity of the surface 212S and enabling an efficient wire bond process in a later manufacturing stage.

FIG. 2b schematically illustrates the semiconductor device 200 in a further advanced manufacturing stage, in which, for instance, the device 200 may be provided as a separate entity by appropriately dicing the substrate 201 as to obtain individual semiconductor devices. During the entire process sequence for separating the substrate 201, the protective layer 240 may efficiently suppress an interaction of the surface 212S with the environment. It should be appreciated that, if desired, any additional protective material may be formed above the dielectric layer stack 220 and the protective layer 240 so as to provide enhanced integrity of the device 200, wherein a corresponding material may be removed prior to performing a wire bond process for bringing a bond wire 230 in contact with the metal region 212. During the deposition and the removal of a corresponding mask material, for instance in the form of a polymer material and the like, the protective layer 240 may provide the desired integrity of the surface 212S. During the wire bond process, the bond wire 230 may be treated so as to receive a ball 230A, if required, at one end and may be aligned to the opening 220A on the basis of well-established procedures and wire bond equipment. During the bond process, the ball 230A may be brought into contact with the protective layer 240, while a down force may also be exerted in combination with the application of an appropriate temperature and ultrasonic energy with a specified frequency and intensity.

Figures 2C, 2D:
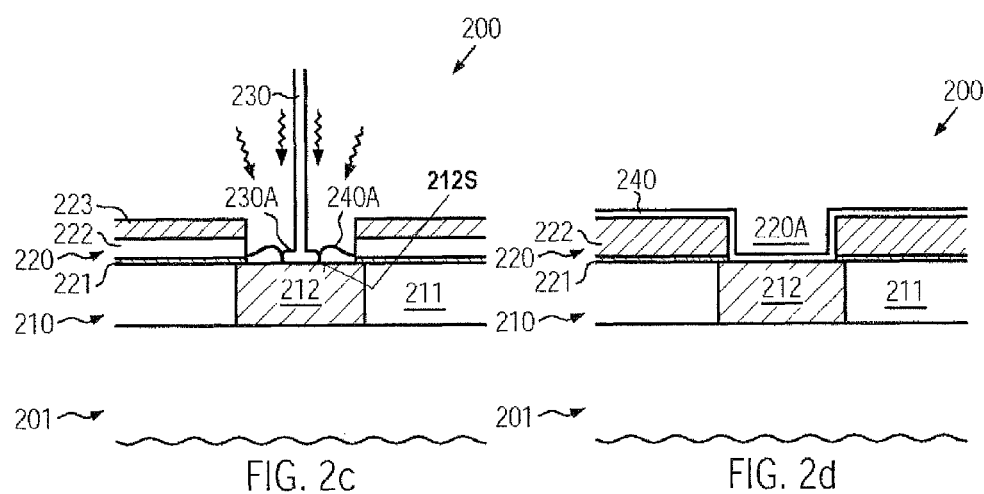

FIG. 2c schematically illustrates the device 200 in an advanced stage of the wire bonding process, in which the ball 230A, or an end portion of the wire if the ball 230A is not formed, may be deformed upon contacting the layer 240 and may also "crack" the layer 240, thereby displacing the cracked portions from below the deformed ball 230A and establishing, in some illustrative embodiments, a direct contact with the surface 212S. That is, due to the elevated temperature and the applied ultrasonic energy, the deformed ball 230A may be welded to the surface 212S, thereby establishing an intermetallic connection so as to obtain a reliable wire bond contact. In some illustrative embodiments, the initial thickness of the protective layer 240 may be selected such that, upon deforming the ball 230A, when contacting the protective layer 240, a reliable contact with the displaced material 240A may also be established, thereby even further enhancing the reliability of the wire bond contact between the bond wire 230 and the surface 212S. For this purpose, an initial thickness of approximately 10-100 nm may be used, for instance, for a nickel-based protective layer, thereby enhancing the overall characteristics of the wire bond connection.

Similarly, when a substantial insulating material may be used for the protective layer 240, a thickness thereof may be selected within an appropriate range, as previously specified, thereby reliably displacing the insulating material and providing a reliable and stable intermetallic contact between the deformed ball 230A and the surface 212S. Moreover, during the entire wire bond process, the presence of the material of the protective layer 240 may provide superior integrity of the surface 212S and may also maintain confinement of the copper material in the region 212 during the further processing of the device 200, for instance by enclosing the device 200 with an appropriate packaging material, as will be described later on.

With reference to FIGS. 2d-2f, further illustrative embodiments will now be described in which the protective layer 240 may be formed on the basis of a non-selective deposition technique using a conductive material, which may then be selectively removed from undesired surface portions of the device 200.

FIG. 2d schematically illustrates the device 200 in a manufacturing stage in which the dielectric layer stack 220 may comprise one or more dielectric layers, such as the layers 221 and 222, having formed therein the opening 220A, in which is formed on sidewalls and a bottom of the protective layer 240, which also extends across horizontal surface portions of the stack 220. In the illustrative embodiment shown, the protective layer 240 may be provided in the form of a conductive material, such as a barrier material as may typically be used in combination with copper-based metal systems, for instance, in the form of tantalum, tantalum nitride, titanium, titanium nitride or any combinations thereof, or any other materials. In this case, the barrier or protective layer 240 may be deposited on the basis of well-established deposition techniques, such as CVD, sputter deposition and the like, using respective process resources as may also be employed during the formation of lower-lying levels of the semiconductor device 200. As previously explained, the layer 240 may be provided with an appropriate thickness so as to enable a reliable wire bond contact, as previously described with reference to FIGS. 2b and 2c.

FIG. 2e schematically illustrates the semiconductor device 200 during a removal process 241 for removing a portion of the protective layer 240 from laterally extending surface areas of the stack 220 in order to provide electrically insulated openings 220A. In one illustrative embodiment, the removal process 241 may comprise a chemical mechanical polishing or planarization (CMP) process, in which the material outside the opening 220 may be removed with significantly increased removal rate compared to the material of the layer 240 within the opening 220A.

FIG. 2f schematically illustrates the semiconductor device 200 according to a still further illustrative embodiment in which a further protective material 242 may be provided, for instance in the form of a resist material, a polymer and the like, to enhance the integrity of the protective layer 240 within the opening 220A during the removal process 241. That is, the material of the layer 242 may be deposited on the basis of an non-conformal deposition technique, such as a spin-on process and the like, and may be subsequently removed at least outside the opening 220A along with the non-desired portion of the protective layer 240, followed by a further etch process for removing any residues of the protective material 242. Consequently, enhanced integrity of the material 240 within the opening 220A may be accomplished.

Thereafter, the further processing may be continued, as previously described with reference to FIGS. 2b-2c, that is, based on the protective material 240, which may now also be provided at sidewalls of the opening 220A, the bond wire 230 may be brought into contact with the surface 212S in the presence of the protective material 240.

With reference to FIGS. 2g-2i, further illustrative embodiments will now be described in which an insulating protective material may be selectively formed on the exposed portion of the surface 212S by a respective treatment, which, in some illustrative embodiments, may be performed on the basis of a wet chemical treatment so as to establish a continuous surface layer for maintaining enhanced integrity of the metal region 212 prior to and during the wire bond process.

FIG. 2g schematically illustrates the device 200 after a patterning process for exposing a portion of the surface 212S by means of the opening 220A formed in the dielectric layer stack 220. As previously indicated, prior to depositing the layer stack 220 and/or after exposing the surface 212S during the entire patterning process, respective contaminants 212A may have been formed, for instance, by interaction with reactive components, such as oxygen, fluorine and the like, which may have to be removed prior to forming the protective layer 240. For this purpose, in one illustrative embodiment, the process 241 for forming the protective layer 240 may comprise a wet chemical etch process performed on the basis of a formulation including an agent and a surface reactant that may undergo a chemical reaction with the exposed surface 212S, thereby forming the substantially continuous protective layer 240. For example, the surface reactant may represent a so-called corrosion inhibitor formed, for instance, on the basis of triazol or any compounds thereof, such as benzene triazol (BTA), as are known in the art for preventing or reducing corrosion of copper surfaces and the like. The corrosion inhibitor may be provided in combination with an agent for removing the contaminations 212A, such as diluted hydrofluoric acid (HF).

FIG. 2h schematically illustrates the semiconductor device 200 after the completion of the wet chemical process 241, thereby forming the continuous protective layer 240 selectively on the exposed portion of the surface 212S. For example, when using BTA or any other appropriate derivative thereof, the protective layer 240 may be stable and comprise a certain amount of carbon and may have a thickness of approximately 1-10 nm, as may be considered appropriate for the further processing in forming a wire bond contact.

FIG. 2i schematically illustrates the semiconductor device 200 in a further advanced manufacturing stage, i.e., after dicing the substrate 201 and subjecting the device 200 to a wire bond process 232. As shown, the bond wire 230 may be brought into contact with the protective layer 240 under the application of pressure and an appropriate temperature, while also using ultrasonic energy, as previously explained. In some illustrative embodiments, the elevated temperature may result in increased material removal of the protective layer 240, that is, the material of the layer 240 may be "evaporated" in a more or less degree, thereby facilitating a direct contact of the ball 230A with the surface 212S. Hence, the surface 212S may be efficiently exposed upon contact with the ball 230A, thereby providing enhanced process efficiency, irrespective of any process-induced variations in layer thickness of the protective layer 240. Hence, also in this case, a highly efficient process sequence may be accomplished during the selective formation of the protective layer 240, since it may be combined with the removal of the contaminants 212A (FIG. 2gA) without adding additional process steps.

With reference to FIGS. 2j-2k, further illustrative embodiments are described in which the protective layer 240 may be deposited in a non-selective manner on the basis of an insulating material that, in some illustrative embodiments, may be compatible with the further processing of the device 200.

FIG. 2j schematically illustrates the device 200 during the process 241 in the form of a non-selective deposition process performed on the basis of process conditions that enable a highly conformal deposition of the layer 240 or which enable at least coverage of the bottom of the opening 220A with enhanced control of the resulting thickness of the layer 240. For example, well-established CVD techniques for forming appropriate dielectric materials, such as silicon nitride, silicon carbide, nitrogen-containing silicon carbide, silicon dioxide and the like, may be used during the process 241. By controlling the thickness at least at the bottom of the opening 220A so as to be within the above-specified range of, for instance, 1-10 nm, the desired degree of protection of the surface 212S may be accomplished, while also a negative effect on the wire bonding process may be substantially avoided.

FIG. 2k schematically illustrates the device 200 in a further advanced manufacturing stage, for instance, after the separation of individual devices and after performing a wire bond process. Hence, the bond wire 230, e.g., the deformed ball 230A thereof, may be in contact with a portion of the surface 212S, thereby forming the desired intermetallic connection, while the displaced material portion of the layer 240, in combination with the remaining material of the layer 240, may further provide enhanced integrity of the metal region 212. Due to the compatibility of the protective layer 240 with the copper material, a removal thereof prior to performing the wire bond process may be omitted. Consequently, also in this case, a highly efficient process sequence may be accomplished where a non-selective deposition process on the basis of well-established techniques and resources may not contribute substantially to the overall process complexity.

Figure 2M:
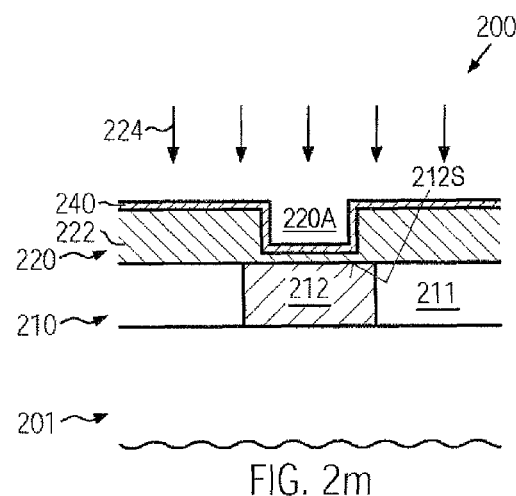

With reference to FIGS. 2l-2m, further illustrative embodiments will be described in which the protective layer 240 may be formed during the patterning of the opening 220A by establishing an appropriate process ambient at the final phase or immediately after the patterning so as to create a polymer layer on exposed surface portions of the device 200.

FIG. 2l schematically illustrates the device 200 during an etch process 224 performed on the basis of an etch mask 225, such as a resist mask, a hard mask and the like, to form the opening 220A in the dielectric layer stack 220. For this purpose, an appropriate anisotropic etch recipe may be used for patterning the opening 220A, which may include the etching of different materials when a plurality of individual dielectric layers, such as the layers 221, 222, 223 (see FIG. 2a) may be provided in the stack 220. During complex etch processes, typically, a specified degree of polymer material may be introduced into the plasma-assisted etch ambient in order to establish a desired etch behavior with respect to the directionality of the material removal in combination with the directionality of the ion bombardment obtained by the plasma conditions during the etch process 224. For example, a specified degree of polymer material may result in a certain degree of inertness on sidewalls of the opening 220A, thereby obtaining a desired degree of anisotropic etch behavior.

FIG. 2m schematically illustrates the semiconductor device 200 in accordance with illustrative embodiments in which, at least in a final phase, an increased amount of polymer material may be incorporated into the etch ambient, thereby promoting the creation of a polymer layer, which may act as a protective layer 240. For example, at the final phase of the patterning process for forming the opening 220A, an increased amount of polymer precursor material may be added to the etch ambient, while the introduction of a reactive component, such as fluorine, chlorine and the like, may be reduced. Consequently, the layer 240 may be formed with a thickness that may be controlled on the basis of parameters of the plasma ambient and the duration of the phase involving the enhanced polymer concentration. For example, at a final phase of the etch process 224, the resist mask 225 may be removed, while also opening a residual layer of the stack 220, which, for instance, may be accomplished by using an oxygen plasma for etching the resist material 225, while also a controlled amount of fluorine may be incorporated into the etch ambient. Upon removing the resist mask 225, and exposing the surface 212S, the supply of reactive components may be reduced and an increased amount of polymer material may be added to build up the protective layer 240, while not unduly affecting the exposed portion of the surface 212S. In other cases, after exposing the surface 212S, the plasma ambient may be appropriately configured so as to further remove contaminants, for instance on the basis of a hydrogen and ammonia containing plasma, after which an increased amount of polymer precursor material may be applied to form the protective layer 240.

Thereafter, the further processing may be continued as previously described, i.e., a wire bond contact may be established in the presence of the protective layer 240.

With reference to FIGS. 3a-3f, further illustrative embodiments will now be described in which the protective layer may represent a part of the dielectric layer stack formed above the last metallization layer.

Figures 3A, 3B:
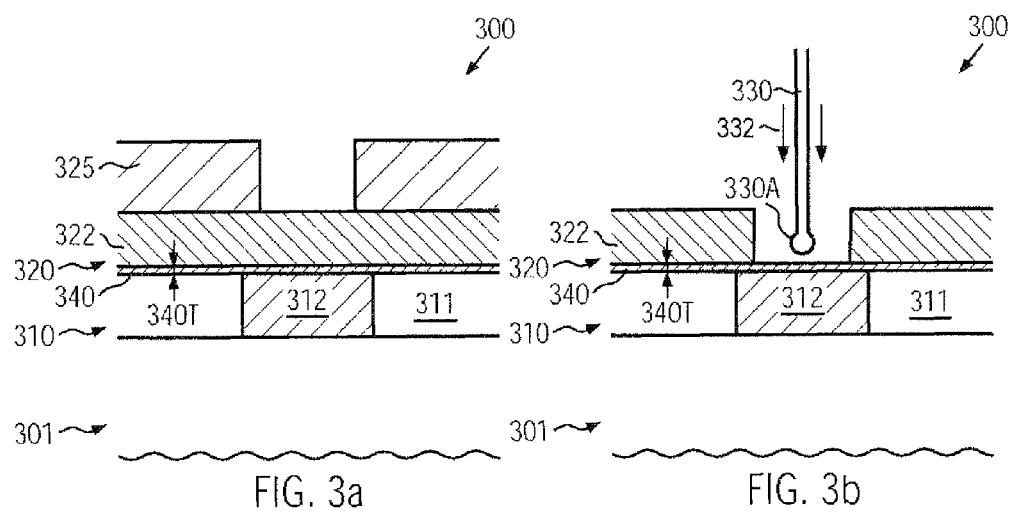
FIGS. 3a-3f schematically illustrate cross-sectional views of a semiconductor device during various manufacturing stages in forming a wire bond connection using a protective layer formed prior to the patterning of the final dielectric layer stack, according to yet other illustrative embodiments.

FIG. 3a schematically illustrates a semiconductor device 300 comprising a substrate 301 including one or more device levels and one or more metallization levels, above which may be formed a last metallization layer 310. The metallization layer 310 may comprise a metal region 312 embedded in a dielectric material 311. With respect to the components described so far, the same criteria apply as previously explained with reference to the devices 100 and 200. Furthermore, the semiconductor device 300 may comprise a dielectric layer stack 320 which may comprise, in one illustrative embodiment, a first dielectric layer 340 and a second dielectric layer 322. For example, the first dielectric layer 340 may be comprised of any appropriate material for confining the metal region 312 while also having a high etch selectivity to the second dielectric layer 322. For example the first dielectric layer 340 may be provided in the form of silicon nitride, nitrogen-containing silicon carbide and the like, while the layer 322 may be provided as a silicon dioxide material, a silicon oxynitride material and the like, wherein it should be appreciated that the stack 320 may comprise more than two layers, as will be described later on in more detail. The first dielectric layer 340 may be provided with an initial thickness 340T that is selected such that a desired degree of etch stop capability may be accomplished, while a desired degree of integrity of the metal region 312 may also be obtained after patterning the dielectric layer 322 of the stack 320 on the basis of an appropriate etch mask 325. For instance, for the above-specified material, a value of approximately 5-10 nm for the thickness 340T may be used according to some illustrative embodiments.

The semiconductor device 300 as shown in FIG. 3a may be formed on the basis of well-established techniques as previously described, wherein, after forming the last metallization layer 310, the stack 320 may be deposited on the basis of process techniques so as to appropriately control the thickness 340T in accordance with device requirements, as specified above, while the material 322 may also be formed with a desired material composition and thickness. Next, the mask 325 may be provided on the basis of well-established lithography techniques. Next, an etch process may be performed on the basis of appropriate etch recipes to etch through the layer 322, while using the layer 340 as an efficient etch stop material.

FIG. 3b schematically illustrates the device 300 in a further advanced manufacturing stage, that is, after separating individual chip areas of the device 300, and during a wire bond process 332, in which a bond wire 330 including a ball 330A may be brought into contact with the metal region 312 in the presence of the exposed portion of the layer 340, which acts as a protective layer, while at the same time not negatively affecting the bonding process 332, as previously explained. Thus, also in this case, a highly efficient process flow may be established without requiring additional process steps for forming the protective layer 340.

Figures 3C, 3D:
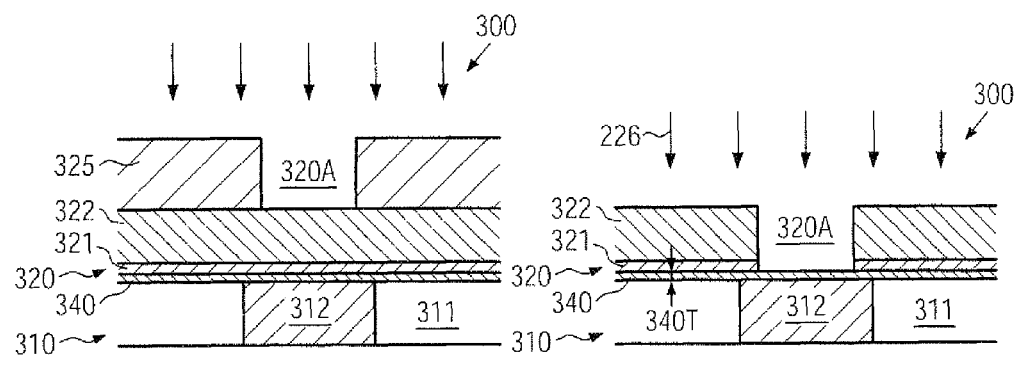

FIG. 3c schematically illustrates the semiconductor device 300 according to further illustrative embodiments in which the dielectric layer stack 320 may comprise more than two individual layers to enhance the overall process efficiency and integrity of the protective layer 340. In the embodiment shown, an additional etch stop layer 321 may be provided to enable the patterning of the layer 322 without compromising the integrity of the protective layer 340. For instance, the additional etch stop layer 321 may be provided so as to also have a different removal rate with respect to the protective layer 340, thereby enabling selective removal of the material of the layer 321 with respect to the layer 340, wherein, however, due to the significantly reduced thickness of the layer 321 compared to the layer 322 in the embodiment shown in FIGS. 3a-3b, a significantly enhanced degree of process uniformity may be accomplished during the removal of the layer 321, thereby obtaining a high degree of predictability of the amount of material removed from the layer 340 during the corresponding etch process. Hence, during a first step, the layer 322 may be patterned by using the layer 321 as an efficient etch stop material. For instance, the material 322 may be provided in the form of a silicon nitride material, while the layer 321 may represent a silicon dioxide material. Thus, the etch process may be reliably stopped within the layer 321 in accordance with well-established selective etch recipes. Thereafter, the material of the layer 321 may be etched selectively to the layer 340, which may be provided in the form of silicon nitride, silicon carbide, nitrogen-containing silicon carbide and the like, wherein a material removal of the layer 340 may be maintained at a very low level, thereby enhancing the across-substrate uniformity of the patterning process for forming an opening 320A, the bottom of which may be defined by the layer 340 having a superior uniform thickness.

FIG. 3d schematically illustrates the device 300 during the corresponding etch process 226 for exposing the layer 340 within the opening 320A, wherein the thickness 340T may substantially correspond to an initial deposition thickness or may differ therefrom by a highly predictable amount, thereby providing enhanced process uniformity during the subsequent wire bond process.

Figures 3E, 3F:
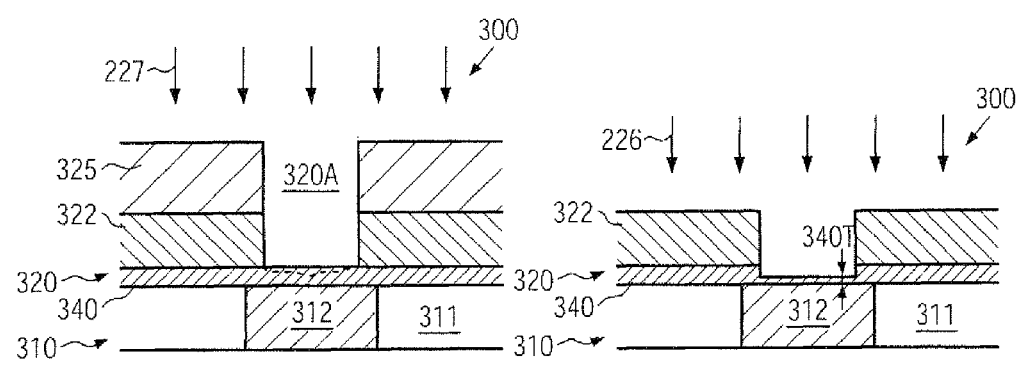

FIG. 3e schematically illustrates the device 300 according to a still further illustrative embodiment in which the dielectric layer stack 320 may comprise the first dielectric layer 340 with a sufficient thickness so as to reliably stop therein an etch process 227 for patterning the one or more layers 322. For example, silicon nitride, nitrogen-containing silicon carbide and the like may be provided with a thickness of approximately 20-60 nm, depending on the overall process strategy. Thus, during the final phase of the etch process 227, the layer 340 may be increasingly exposed within the opening 320A and may result in a moderate material removal so as to finally reliably stop the etch process 227 in the layer 340.

FIG. 3f schematically illustrates the device 300 in a further etch process designed to further remove material of the layer 340, which may, for instance, be accomplished on the basis of well-established etch recipes with a moderately low etch rate to provide enhanced controllability. During the process 226, the finally desired thickness 340T may be adjusted so as to comply with the requirements for the subsequent wire bond process, while also maintaining integrity of the underlying metal region 312. For example, the thickness 340T may be adjusted to a value of approximately 1-10 nm, depending on the process parameters for the subsequent wire bond process and the overall material characteristics of the layer 340. In one illustrative embodiment, the etch process 226 may include a plasma etch step for removing the mask 325 (FIG. 3e), wherein, at the same time or at a certain phase of the plasma etch process, a specified small amount of fluorine may be incorporated into the plasma ambient to initiate material removal of the layer 340 with high controllability in order to obtain the desired final thickness 340T.

Consequently, the provision of the protective layer 340 may be advantageously combined with the formation and/or patterning of the dielectric layer stack 320, thereby providing reduced process complexity while nevertheless avoiding the provision of an aluminum-based terminal metal layer for providing efficient wire bond contacts.

Figure 4:
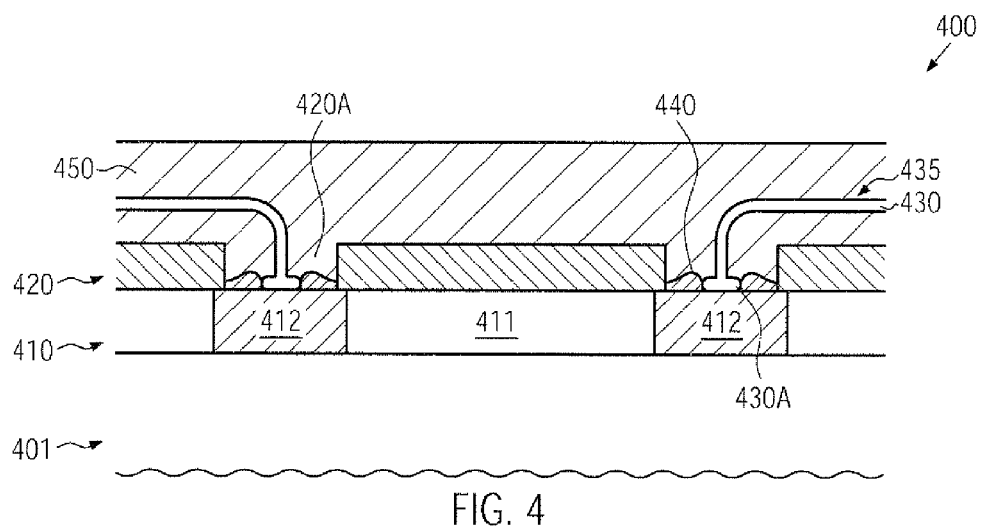
FIG. 4 schematically illustrates the cross-sectional view of a semiconductor device including a wire bond structure, in which a copper-containing surface may be directly connected to a bond wire, wherein portions of the bond area may be covered by a protective material, according to illustrative embodiments.

FIG. 4 schematically illustrates a semiconductor device 400, which may represent an advanced device having incorporated therein a complex metallization system on the basis of highly conductive metals, such as copper, and a bond contact structure may provide the connection to the periphery while avoiding an aluminum-based terminal metal layer. For instance, the device 400 may represent a memory device, a test structure for complex CPUs, a device including analog circuitry and the like, in which advanced manufacturing techniques may be required, while the I/O capabilities of a wire bond structure may be appropriate for connecting the device 400 with peripheral components. The device 400 may comprise one or more device levels and one or more metallization levels, which, for convenience, are commonly referred to as 401. Additionally, a last metallization level 410 may comprise a plurality of metal regions 412, a portion of which may act as contact areas for a wire bond structure 435. The metal regions 412 may be embedded into a dielectric material 411, above which may be formed a passivation layer stack 420. It should be appreciated that the "stack" 420 may be comprised of a single material layer or may include a plurality of individual material layers, depending on the overall requirements. The contact structure 435 may include a bond wire 430 having a contact portion 430A, which is in direct contact with a surface portion of the metal regions 412, thereby forming an intermetallic connection. Furthermore, the contact portion 430A may be in contact with a material 440 which may also be in contact with the metal of the region 412 within respective openings 420A formed in the dielectric stack 420 so as to define a contact area for the wire bond structure 435. The material 440 may have a different material composition compared to a packaging material 450, which may confine the metallization layer 410, the dielectric layer stack 420 and the wire bond structure 435, which in turn may be connected to contact leads or pins (not shown), depending on the overall configuration of a package formed by the package material 450. The semiconductor device 400 may be formed in accordance with process techniques as previously described with reference to the devices 200 and 300, wherein, in particular, the wire bond contact structure 435 may be formed on the basis of a substantially aluminum-free technique. That is, the bond wires 430 may be brought into contact with the metal regions 412 without providing a terminal aluminum layer on the metal regions 412, wherein the respective protective layer may provide the desired integrity and robustness of the resulting contact, wherein the residues of the protective layer, that is, the material 440, may additionally provide enhanced integrity during the further processing, for instance by forming the package material 450, in accordance with any appropriate process techniques. Thus, complex metallization systems on the basis of copper may be used for the device 400, without requiring additional resources for depositing and patterning aluminum-based terminal metal layers, as previously explained.

As a result, the present disclosure provides semiconductor devices and manufacturing techniques in which reduced process complexity may be accomplished during forming wire bond structures by eliminating aluminum-based deposition and patterning sequences. For this purpose, a protective layer may be provided upon exposure of a reactive metal surface, such as a copper-containing surface, wherein the wire bond process may be performed in the presence of the protective layer, which may have an appropriate thickness so as to enable an intermetallic connection with the reactive metal surface under highly uniform and predictive conditions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric layer stack above a metallization layer formed above a substrate of a semiconductor device, said metallization layer comprising a metal region for connecting to a bond wire;
   forming a recess in said dielectric layer stack so as to define a bond area of said metal region, wherein at least a portion of a bottom layer of said dielectric layer stack within the recess covers said metal region; and
   bonding a lead wire to said metal region in the presence of said bottom layer.

2. The method of claim 1, wherein forming said dielectric layer stack comprises forming a first dielectric layer on said metal region and forming a second dielectric layer on said first dielectric layer and wherein forming said recess comprises etching said second dielectric layer and using said first dielectric layer as an etch stop material such that said first dielectric layer constitutes said bottom layer.

3. The method of claim 2, further comprising establishing a further etch ambient after etching said second dielectric layer and removing a portion of said first dielectric layer so as to adjust a thickness of said bottom layer.

4. The method of claim 2, further comprising forming a third dielectric layer on said second dielectric layer and etching said third dielectric layer selectively with respect to said second dielectric layer.

5. The method of claim 4, wherein the first dielectric layer is formed with a thickness of approximately 10 nm or less.

6. The method of claim 5, wherein said metal region comprises a copper-containing surface.

7. The method of claim 1, wherein bonding said lead wire to said metal region comprises bonding said lead wire to said metal region through at least said portion of said bottom layer.

8. A method, comprising:
  forming a metallization layer above a substrate of a semiconductor device, wherein said metallization layer comprises a metal contact region and said metal contact region comprises a copper-containing upper surface;
  forming a stack of dielectric material layers comprising at least a first layer and a second layer above said metallization layer;
  performing an etch process to form a recess above said metal contact region by removing material of at least said second layer, wherein at least a lower portion of said first layer covers said metal contact region; and
  bonding a lead wire to said copper-containing upper surface of said metal contact region through at least said lower portion of said first layer.

9. The method of claim 8, wherein forming said recess comprises using said first layer as an etch stop layer during said etch process.

10. The method of claim 8, wherein forming said recess comprises removing an upper portion of said first layer during said etch process.

11. The method of claim 8, wherein forming said stack of dielectric material layers comprises forming a third layer above said first layer prior to forming said second layer.

12. The method of claim 11, wherein forming said recess comprises performing a first etch step of said etch process to selectively remove material of said second layer by using said third layer as an etch stop layer.

13. The method of claim 12, wherein forming said recess comprises performing a second etch step of said etch process to selectively remove material of said third layer by using said first layer as an etch stop layer.

14. The method of claim 11, wherein forming said recess comprises adjusting a thickness of said first layer during said etch process.

* * * * *